United States Patent [19]

Kingzett

[11] 4,052,253

[45] Oct. 4, 1977

[54] SEMICONDUCTOR-OXIDE ETCHANT

[75] Inventor: Thomas J. Kingzett, Tempe, Ariz.

[73] Assignee: Motorola, Inc., Chicago, Ill.

[21] Appl. No.: 726,883

[22] Filed: Sept. 27, 1976

[51] Int. Cl.$^2$ .......................................... H01L 21/316
[52] U.S. Cl. ........................................ 156/657; 134/3;
    156/662; 252/79.3
[58] Field of Search ................... 156/7, 17, 662, 657,
    156/644, 654; 134/3; 252/79.3; 148/187

[56] References Cited

U.S. PATENT DOCUMENTS

| | | | |
|---|---|---|---|
| 2,981,610 | 9/1961 | Snyder et al. | 252/79.3 |
| 3,497,407 | 2/1970 | Esch et al. | 252/79.3 |
| 3,507,716 | 4/1970 | Nishida et al. | 148/187 |
| 3,600,241 | 8/1971 | Doo et al. | 156/662 |
| 3,759,762 | 9/1973 | Barone et al. | 148/187 |
| 3,761,313 | 9/1973 | Entwisle et al. | 134/3 |
| 3,769,109 | 10/1973 | MacRae et al. | 156/662 |
| 3,839,111 | 10/1974 | Ham et al. | 156/662 |
| 3,841,904 | 10/1974 | Chiang | 156/657 |

OTHER PUBLICATIONS

Briska et al, IBM Technical Disclosure, "Etchant for Cleaning Silicon Surfaces" vol. 16, No. 10, (1974), p. 3274.

*Primary Examiner*—Charles E. Van Horn
*Assistant Examiner*—Jerome W. Massie
*Attorney, Agent, or Firm*—Henry T. Olsen

[57] ABSTRACT

An etchant for semiconductors having a high preferential etch rate for doped silica particularly phosphorous doped silica, consisting of a 20:20:1 mixture, by volume, of 37% hydrochloric acid, deionized water, and 49% hydrofluoric acid. The etchant is particularly useful in a semiconductor process wherein an emitter opening is washed out following the diffusion thereof.

2 Claims, No Drawings

SEMICONDUCTOR-OXIDE ETCHANT

BACKGROUND OF THE INVENTION

This invention relates to semiconductor manufacture and more particularly to an improved etchant for silica. Still more particularly the invention relates to the clean out of emitter openings following diffusion thereof by an etchant having a high preferential etch rate for doped silica.

In the past a typical etchant for cleaning out emitter openings was a buffered hydrofluoric acid consisting generally of a 15:1:4 mixture of 40% amonium fluoride, hydrofluoric acid, and water. Due to a low preferential etch rate as between the emitter oxide and the base oxide, great care was necessary to avoid etching out the sides of the base oxide to expose the base emitter junction of the transistor. Obviously if this base emitter junction was exposed to the metallization the transistor would be shorted between base and emitter.

It is an object of this invention to provide an improved etchant for semiconductor silica. A further object of the invention to provide an improved etchant for the emitter wash out process.

Further objects and advantages of the invention will be understood from the following complete description thereof.

COMPLETE DESCRIPTION

In the manufacture of transistors a typical process for forming a planar transistor is to thermally grow oxide on a silicon wafer. Using standard photomasking techniques, a base opening is made in the oxide and a base region diffused therethrough. Following forming of another oxide layer over the base region, an emitter opening is formed in the second oxide using the same type of photolithographic technique. Thereafter an emitter diffusion is made, typically of phosphorous, through the emitter opening. At the end of the diffusion cycle a thin thermal oxide which will contain some of the phosphorous dopant is formed over the emitter. The emitter opening is then cleaned out using a wash out process wherein the wafer is dipped for a brief period of time in an etchant solution which in accordance with the invention is a solution of hydrochloric acid, hydrofluoric acid and water. Further, in accordance with the invention, the etch consists of a 20, 20, 1 mixture by volume of 37% HCL, DINIS water and 49% hydrofluoric acid. The preferred etchant has been contrasted with the previously most commonly used etchant which is a buffered hydrofluoric acid and the following results are shown.

| ETCH SOLUTION | HE CONTENT | pH | ETCH RATE OF EMITTER OXIDE | ETCH RATE OF BASE OXIDE |
|---|---|---|---|---|
| 15:1:4 (40% NH$_4$F:HF:H$_2$O) | 2.5% | 5.3 | 14 A/sec | 9.1 A/sec |
| 20:20:1 (37% HCL:H$_2$O:HF) | 1.25% | −0.8 | 50 A/sec | 3.2 A/sec |

("Base Oxide" is the oxide layer over the base diffusion adjacent to the emitter opening after the emitter diffusion cycle).

Thus it will be seen that the etch in accordance with the invention has an extremely low pH as contrasted with the previous commercial etchant and shows a high preferential etch rate as between the emitter oxide and the base oxide. Thereby, the problem of side etching of the base oxide which might expose the base emitter junction is made less likely.

Following the washing out of the emitter oxide the wafer may be metallized to make appropriate contact to the emitter through the emitter opening which is the same opening as was used to provide the emitter diffused region.

What is claimed is:

1. In a process wherein an emitter is formed in a silicon semiconductor through a diffusion window and an oxide formed thereover whereafter the emitter opening is cleaned out by immersing the silicon semiconductor in an etch solution the improvement comprising an etch consisting essentially of hydrochloric acid; hydrofluoric acid and water having a PH of less than 1.

2. A process as recited in claim 1 wherein said etch consists of a 20:1:20 mixture by volume of 37% HCL, 49% HF and deionized water.

* * * * *